United States Patent [19]

Jampathom et al.

[11] Patent Number: 4,846,032
[45] Date of Patent: Jul. 11, 1989

[54] DEVICE AND METHOD FOR SEPARATING PRINTED CIRCUIT BOARDS

[75] Inventors: Sompoppol Jampathom, Oakhurst; Otto Nehring, Englishtown, both of N.J.

[73] Assignees: American Telephone and Telegraph Company, New York, N.Y.; AT&T Bell Laboratories, Murray Hill, N.J.; AT&T Information Systems Inc., Morristown, N.J.

[21] Appl. No.: 200,154

[22] Filed: May 31, 1988

[51] Int. Cl.⁴ ............................................. B26D 3/08
[52] U.S. Cl. ......................................... 83/51; 83/495; 83/678; 83/425.2; 83/885
[58] Field of Search ................ 83/51, 425.2, 431, 883, 83/884, 885, 863, 864, 865, 695, 678, 495

[56] References Cited

U.S. PATENT DOCUMENTS

| | | | |
|---|---|---|---|
| 39,294 | 7/1863 | Leland | 83/495 |
| 1,248,540 | 12/1917 | Peterson | 83/885 |
| 2,053,375 | 9/1936 | Nicholas | 83/863 |
| 2,223,466 | 12/1940 | Spang | 83/885 |
| 2,989,228 | 6/1961 | Glattli | 83/51 |
| 3,312,135 | 3/1967 | Mraz | 83/675 |
| 3,491,632 | 1/1970 | Dovey | 83/885 |
| 3,821,911 | 7/1974 | Seme | 83/51 |
| 3,956,957 | 5/1976 | Corse | 83/482 |
| 4,307,637 | 12/1981 | Vanderhulst | 83/13 |
| 4,459,888 | 7/1984 | Frye | 83/51 |
| 4,614,138 | 9/1986 | Altman | 83/51 |
| 4,675,497 | 6/1987 | Pearl | 219/121 |
| 4,694,722 | 9/1987 | Collier et al. | 83/51 |

OTHER PUBLICATIONS

*Flow Systems* literature; Automotive Applications, Sept. 1984, Paser TM Abrasive Jet Cutting System, The Cutting Edge.

Primary Examiner—Frank T. Yost
Assistant Examiner—Scott A. Smith
Attorney, Agent, or Firm—Samuel R. Williamson

[57] ABSTRACT

A device separates attached multiple printed circuit boards without damaging solder connections and delicate surface mounted components attached to the boards. The device comprises a pair of disc cutters positioned in opposed alignment and minimally spaced apart for providing a bifurcated cutting edge through which commonly attached sections of the printed circuit boards are conveyed while supported by a transporter. The contact pressure on the boards is limited to the commonly attached sections as they are engaged and conveyed by the cutting edge. Minimal stress and vibrations are imparted to the boards and therefore the components connected thereon with this device. The boards are thus separated while avoiding damage to the solder connections or the surface mounted components.

7 Claims, 5 Drawing Sheets

SECTION B-B

SECTION C-C

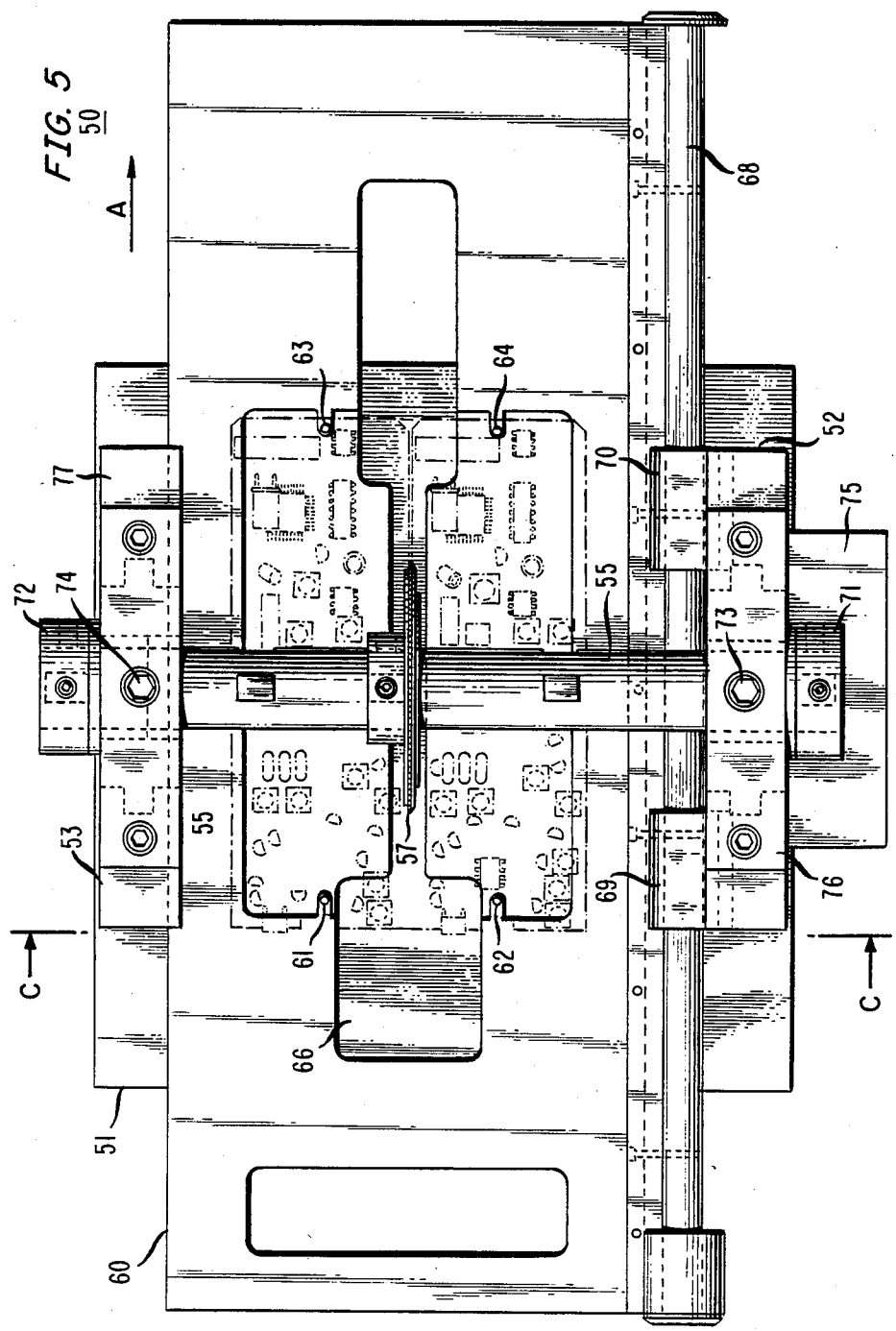

DEVICE AND METHOD FOR SEPARATING PRINTED CIRCUIT BOARDS

BACKGROUND OF THE INVENTION

1. Technical Field

This invention relates generally to cutting systems and more particular to a device for separating a multiple partitioned printed circuit board.

2. Description of the Prior Art

Printed circuit boards are being utilized more in electronic systems as the cost of assembly becomes an increasingly greater part of such systems. To reduce overall manufacturing costs, certain steps have been adopted for assembly of the boards. For example, through-hole components and surface mounted components are conveniently installed in predetermined positions on a printed circuit board by automated equipment such as "pick and place" machines or by a highly skilled operator. To further reduce costs through increased efficiency, in some operations, the through-hole and surface mounted components are assembled on a large substrate that has been previously partitioned into a multiple printed circuit board containing two or more individual circuit boards. This multiple or partitioned printed circuit board is then fully populated with through-hole and surface mounted components at one or more work stations by the automated equipment or operator.

An additional step in the assembly of electronic systems involves the process of separating the partitioned printed circuit board into the individual circuit boards. A number of methods and devices are known and available for performing this operation.

One such method involves a "punch and reinsert" operation wherein the individual circuit boards are punched out of the large substrate before components are inserted thereupon. These circuit boards are then reinserted back into the substrate where they are held by friction while the components are inserted thereupon. Once all the components are inserted, the individual circuit boards are again separated from the substrate. The separation operation involves having an operator warp or distort the substrate such that the individual circuit boards are dislodged. Some stresses are, unfortunately, imparted to the boards through this process and could possibly, damage the boards or the components thereon.

Other methods involve cutting a partitioned printed circuit board once it has been populated with through-hole and surface mounted components. One of these methods involves the use of a band saw which separates the individual circuit boards and also cuts away the excess stock around the border of these boards. This method imparts vibrations to the printed circuit board, however. These vibrations propagate across the board and, in turn, may cause damage to the solder junctions electrically connecting the through-hole and surface mounted components to the board. Also certain surface mounted components are very susceptible to the vibrations from the band saw and may be easily damaged thereby. This method is normally not preferred therefore because of the large vibrations imparted to the printed circuit board through its use.

Another method involves using a water knife cutter which, like the band saw, separates the individual circuit boards and also cuts away the excess stock around the border of these boards. Unlike the band saw, however, the water knife exerts minimal contact pressure on the material being cut due to the small surface area of the water jet stream. Thus, the water knife cutter provides an acceptable method of separating the boards since it exerts minimal stress and vibrations on the boards and therefore the components connected thereon. The disadvantage of this method is the relatively high cost of acquiring a machine employing this type of cutting system.

In keeping with the overall effort to reduce the cost of manufacturing electronic systems, what is desirable, therefore, is an economical device and method that will separate a multiple partitioned printed circuit board into individual circuit board sections without damaging the solder junctions and surface mounted components affixed thereupon.

SUMMARY OF THE INVENTION

In accordance with the invention, a device separates a multiple partitioned printed circuit board without damaging solder connections and delicate surface mounted components attached to the board. The device comprises at least one pair of disc cutters positioned in opposed alignment and minimally spaced apart for providing a bifurcated cutting edge which, upon engagement, conveys and separates the board. The device also comprises a transporter for supporting the board while it is conveyed through the bifurcated cutting edge. The multiple partitioned printed circuit board is thus separated into individual circuit boards with minimal longitudinal and vertical forces being exerted thereupon thereby avoiding damage to the solder connections and surface mounted components.

BRIEF DESCRIPTION OF THE DRAWING

FIG. 5 is a top view of a second embodiment of the board separator assembly in accordance with the invention.

DETAILED DESCRIPTION

Figure 1:
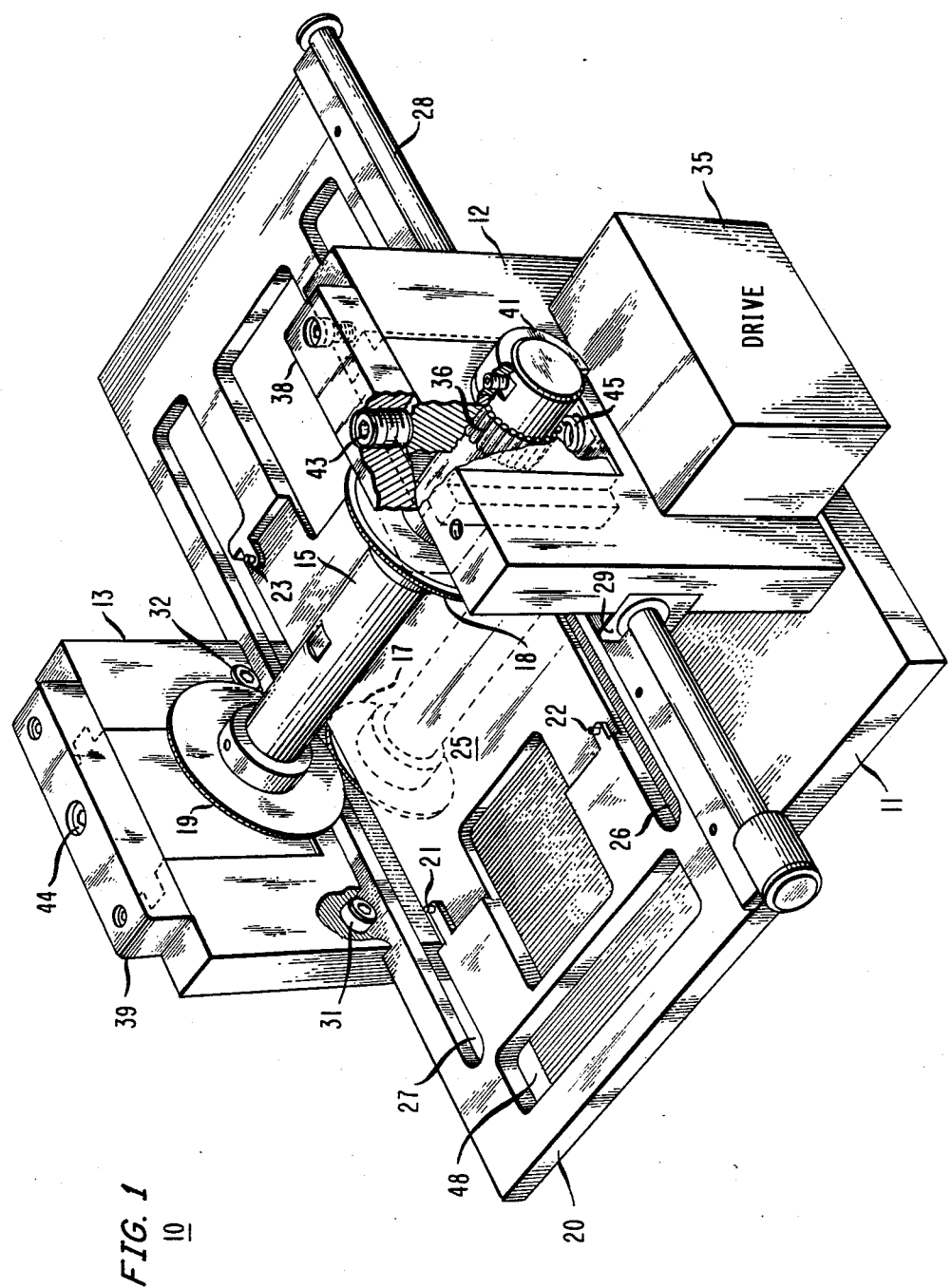
FIG. 1 is a perspective view of a first embodiment of the board separator assembly in accordance with the invention.
Figure 2:
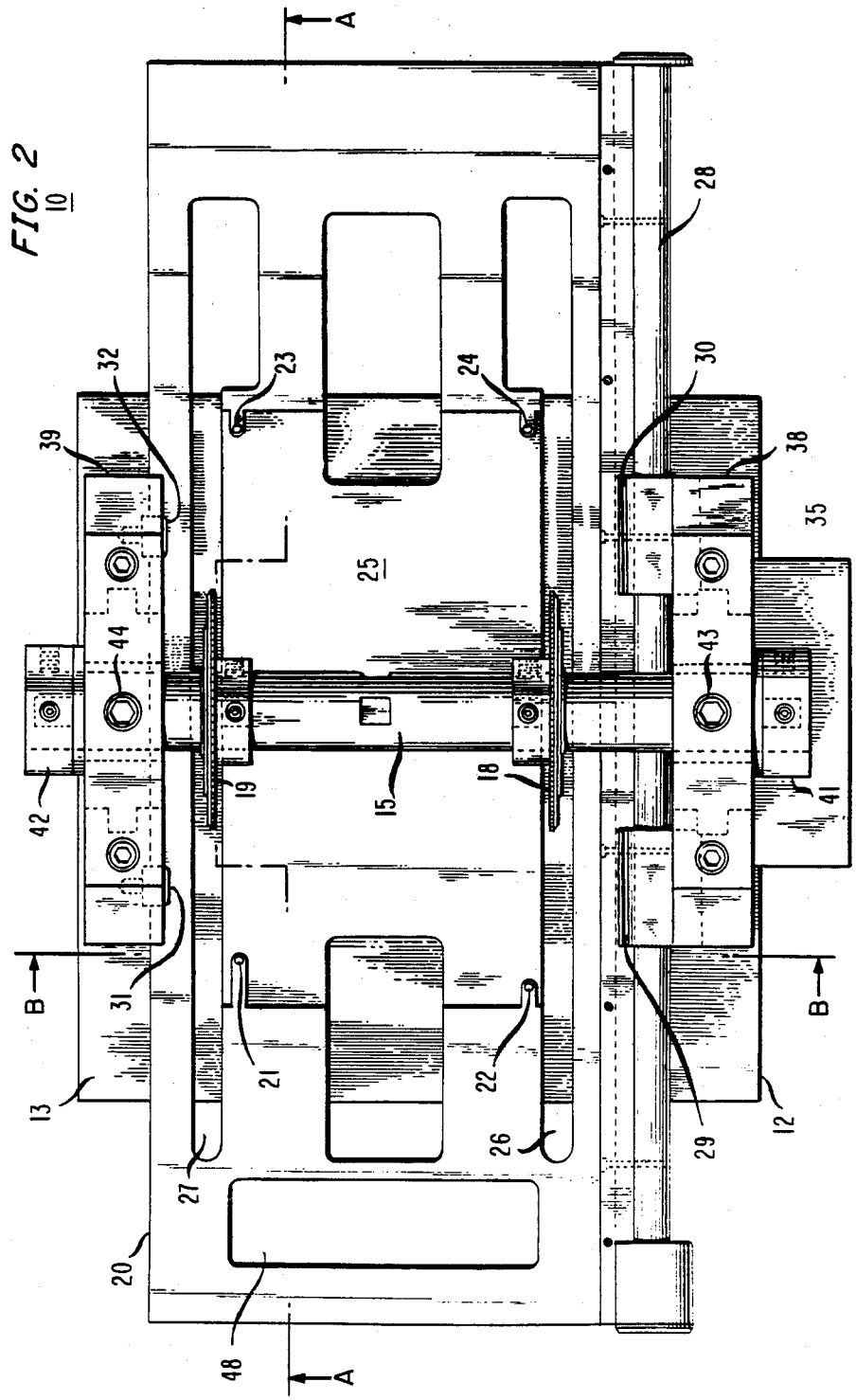
FIG. 2 is a top view of the device shown in FIG. 1.
Figure 3:
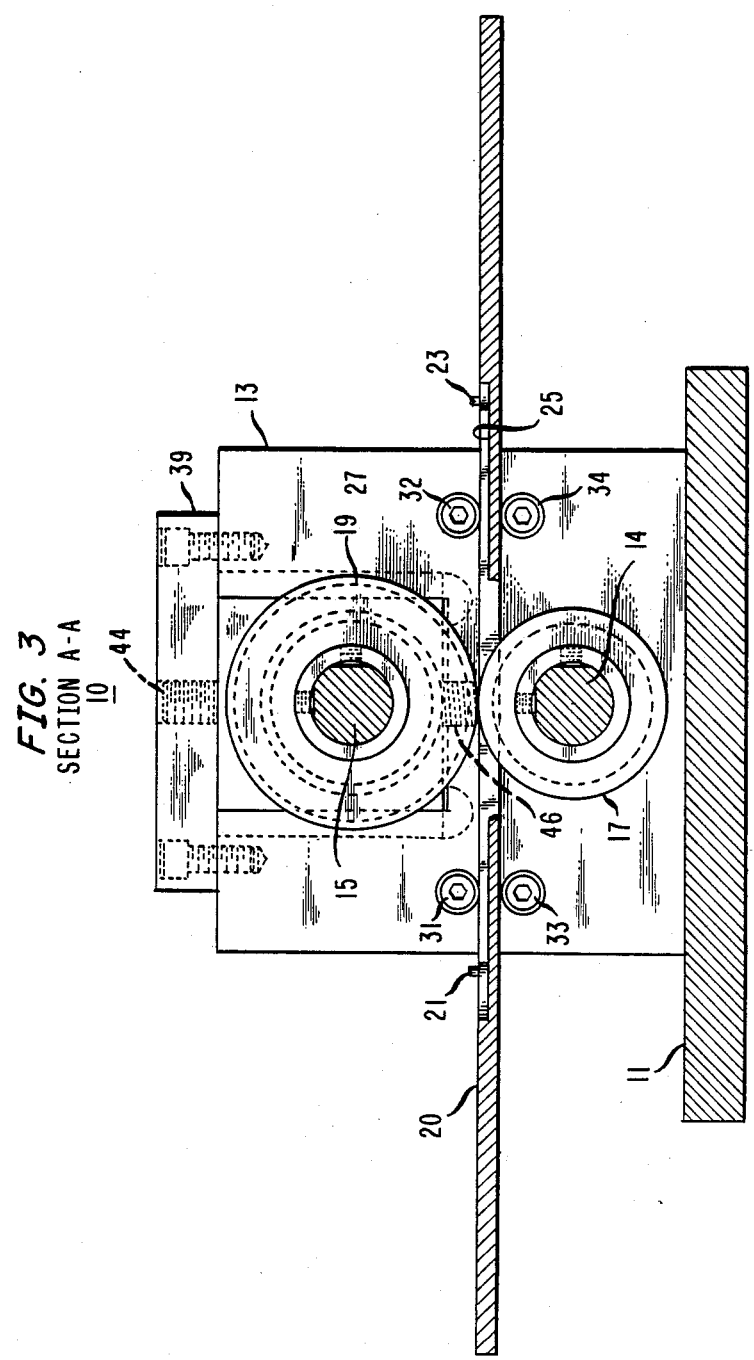
FIG. 3 is a partial sectional view of the device shown FIG. 2 along the lines A—A.

Throughout the drawings, the same elements when shown in more than one figure are designated by the same reference numerals.

With reference to FIGS. 1 through 4 in combination, a board separator assembly 10 shown in perspective view in FIG. 1 includes a base slab 11 and two upstanding side plates 12 and 13 mounted thereupon. Affixed to side plates 12 and 13 are a driver shaft 14 and an idler or driven shaft 15, both more easily seen in FIG. 4. Driver shaft 14 includes mounted disc cutters 16 and 17. Similarly, driven shaft 15 includes mounted driven disc cutters 18 and 19. Disk cutters 16 and 17 are respectively mounted in opposed relationship with disc cutters 18 and 19 to form a first and a second bifurcated cutting edge. Also mounted on the upstanding side plates 12 and 13 is a transporter 20 for supporting a partitioned printed circuit board as the board moves through the cutting edges formed respectively in combination by disc cutters 16 and 18 and 17 and 19.

The transporter 20 includes indexing pins 21 through 24 for mating with openings provided generally at the end or sides of a partitioned circuit board for correct positioning of the board in the board separator assembly. A recessed area 25 on the transporter 20 allows for the partitioned printed circuit board to be properly positioned on the transporter without the surface mounted components located on the bottom thereof contacting the transporter 20.

The transporter 20 also includes parallel and opposed slots 26 and 27. These slots respectively provide clearance for the outer rim of the disc cutters 16 and 17 to project through as the transporter is moved over these disc cutters.

Directional guidance for the transporter is provided primarily by a rod 28 which is attached to one side of the transporter 20 throughout its length. This rod 28 secures the transporter and transverses through two linear Ball bearings 29 and 30 embedded in the upstanding side plate 12. Movement of the transporter 20 is also limited in a direction perpendicular to the direction of translation by upper roller guide pins 31 and 32 and lower roller guide pins 33 and 34 mounted in the upstanding side plate 13.

Figure 4:
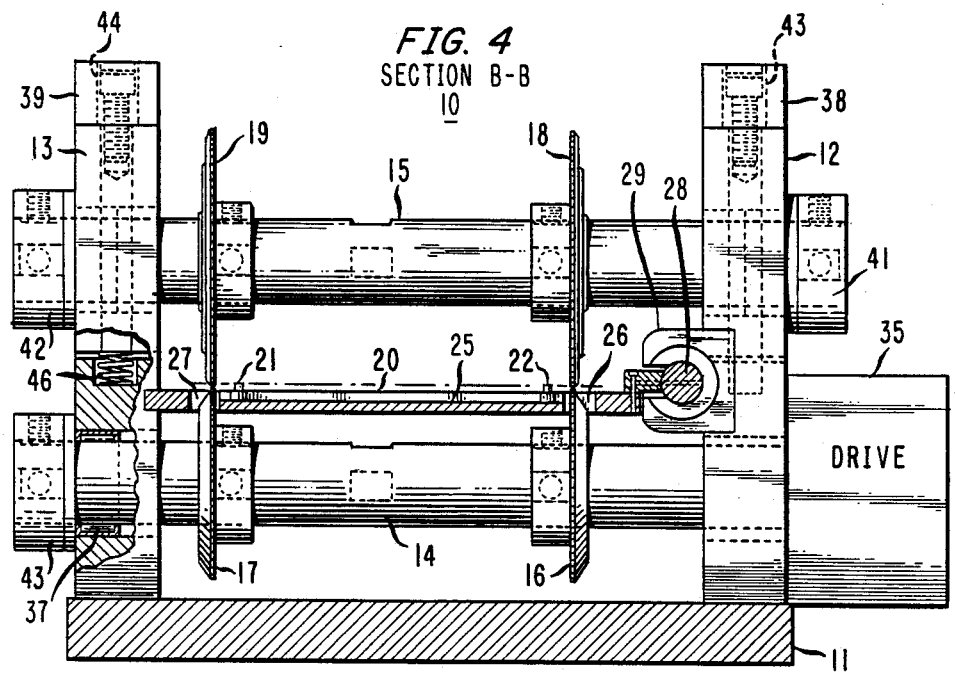
FIG. 4 is a partial sectional view of the device shown in FIG. 2 along the lines B—B.

Both the driver shaft 14 and driven shaft 15 are held in alignment in the side plates 12 and 13 by a roller bearing positioned on each side and illustratively shown in FIGS. 1 and 4 by roller bearings 36 and 37 respectively. Limiting collars 41 through 43 secure both ends of the driven shaft 15 and a first end of the driver shaft 14 to the side plates 12 and 13. Securing a second end of the driver shaft 14 is a drive 35 attached for rotating the driver shaft and therefore the driver disc cutters 16 and 17. This drive means may be, for example, either a stepper motor or even a hand crank for manual rotation of the the driver disc cutters 16 and 17.

A tongue and groove assembly in both of the side plates 12 and 13 houses the two roller bearings, e.g. bearing 36, supporting the driver shaft 15. This assembly allows for adjustment of the height of the driven shaft 15, thereby setting the spacing between the upper and lower disc cutters. End caps 38 and 39 respectively retain the tongue and groove assemblies in side plates 12 and 13. Adjusting screws 43 and 44 respectively cooperate with compression springs 45 and 46 in adjusting the height of the driven shaft 15 such that the spacing between the driver disc cutters 16 and 17 and the driven disc cutters 18 and 19 is only a few thousandths (typically 3-5 thousandths) of an inch apart.

By way of operations, a populated partitioned circuit board ready to be separated is positioned on indexing pins 21 through 24 by an operator or suitably automated machinery. The transporter 20 is then advanced to a point where the two disc cutter pairs 16 and 18 and 17 and 19 engage the circuit board. This initial advancement of the transporter 20 may be either by mechanical means or simply by manual means where an operator advances the transporter 20 to the engagement point by utilizing an opening 48. Once the board is engaged by the disc cutter pairs, the drive 35 begins to rotate the driver shaft 14 and the board is cut as it advances between the driver disc cutters 16 and 17 and the driven disc cutters 18 and 19. Beyond the engagement point the drive 35 is the only means used to advance the circuit board and transporter 20. The partitioned circuit board is thus separated with minimal longitudinal force, the vertical force being confined to an area between the cutting edges. Thus minimal stress is applied to the solder connections and the surface mounted components as the board passes between the driven and driver disc cutters.

Figure 6:
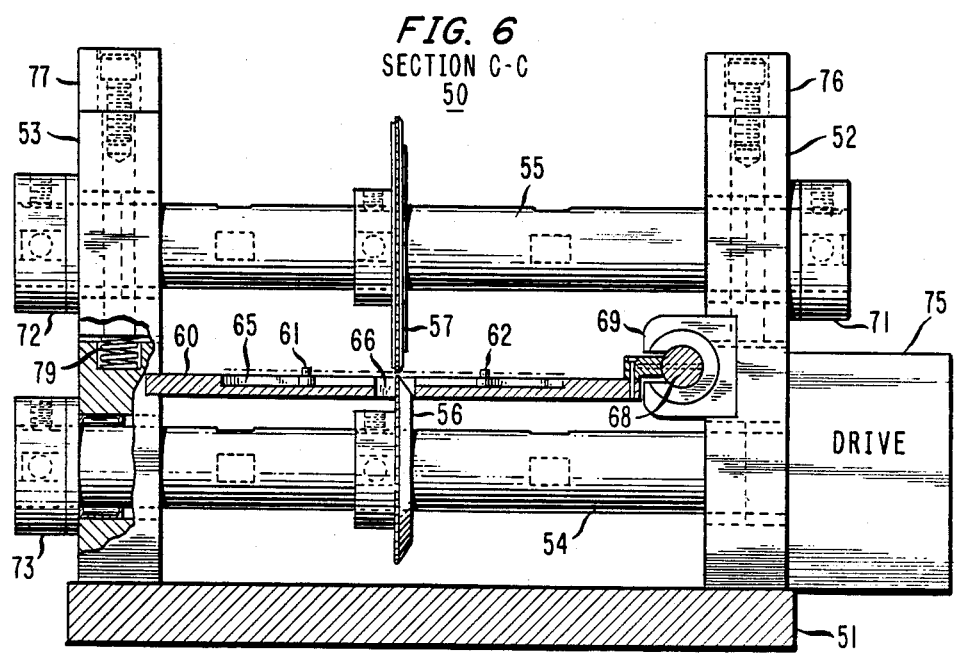
FIG. 6 is a partial sectional view of the device shown in FIG. 5 along the lines C—C.

With reference to FIGS. 5 and 6 in combination, a second embodiment of a board separator assembly 50 is disclosed in accordance with the present invention. The structure and operation of this board separator assembly is similar to that of the board separator assembly 10 shown in FIGS. 1 through 4. The principal difference is that this board separator assembly employs only one driver disc cutter and one driven disc cutter.

Included in the board separator assembly 50 are a base slab 51 and two upstanding side plates 52 and 53 mounted thereupon. Affixed to each of the side plates 52 and 53 are a driver shaft 54 and a driven shaft 55. A disc cutter 56 is mounted to the driver shaft 54 and a disc cutter 57 is mounted to the driven shaft 57. Also mounted on the two upstanding side plates 52 and 53 is a transporter 60 for carrying a printed circuit board through the cutting edge formed by disc cutters 56 and 57.

The transporter 60 includes indexing pins 61 through 64 for mating with openings provided generally at the end or sides of a partitioned circuit board for correct positioning of the circuit board in the board separator assembly. A recessed area 65 on the transporter 60 also allows for the board to be inserted without the surface mounted components on the bottom thereof contacting the transporter 60. The transporter 60 also includes a slot 66 that provides clearance for the outer rim of the disc cutter 56 to project through as the transporter is moved over this disc cutter.

Directional guidance for the transporter 60 is provided by a rod 68 which is attached to one side of the transporter throughout its length. This rod 68 secures the transporter and transverses through two linear ball bearings 69 and 70 embedded in the upstanding side plate 52. As in the board separator assembly of FIG. 1, movement of the transporter 60 is also limited in a direction perpendicular to the direction of translation by upper and lower roller guide pins (not shown) mounted in the upstanding side plate 53. The driver shaft 54 and driven shaft 55 are also mounted in the side plates 52 and 53 by roller bearings with limiting collars 71 through 73 securing both ends of the driven shaft 55 and one end of the driver shaft 54 to the side plates 52 and 53. Drive 75 secures the other end of the driver shaft and also provides for rotating the driver shaft and therefore the driver disc cutter 56. An adjustable tongue and groove assembly in both of the side plates 52 and 53 allows adjustment of the height of the driven shaft 55. Adjusting screws 73 and 74 respectively cooperate with compression springs (only spring 79 is shown) disposed in the side plates 52 and 53. These screws and springs determine the spacing of the driven shaft 55 such that the spacing between the driver disc cutter 56 and the driven disc cutter 57 is only a few thousandths of an inch apart. End caps 76 and 77 respectively retain the tongue and groove assemblies in side plates 52 and 53.

Shown in phantom in FIG. 5 along with the board separator assembly 50 is a partitioned printed circuit board partially separated and being moved in a direction indicated by the arrow A. The through-hole components as shown on the top surface of this board are attached prior to the board separation process. The surface mounted components (not shown) are also attached to the bottom of the board prior to this separation process. Engagement of this printed circuit board by the driven disc cutter 57 and the driver disc cutter 56 is by advancing the transporter 60 until the driven disc cutter 57 and the driver disc cutter 56 engage the board typically in a grooved portion thereof. It is this grooved portion that partitions the circuit board into the individual circuit boards. From this point on, advancement of the transporter is via the drive 75 rotating the driver shaft 54 and therefore the driver disc cutter 56. Because of the very close spacing between the two opposed discs, the circuit board is gripped between the discs and advances as the driver disc cutter 56 rotates. The driven disc cutter 57 turns freely and provides the opposed force necessary for cutting the board. The board is thus separated as it passes between the driver and driven disc cutter in the same manner of operation of the board separator assembly of FIG. 1.

Obviously, many modifications and variations of the present invention are possible in light of the above teachings. It is therefore to be understood that within the scope of the appended claims, the invention may be practiced otherwise than as specifically described.

What is claimed is:

1. A method of separating a populated multiple partitioned printed circuit board comprising the steps of:
    positioning in opposed alignment and minimally spacing apart at least one pair of disc cutters for providing a bifurcated cutting edge, a first one and a second one of the pair of disc cutters being respectively mounted on a first and a second shaft spaced apart and extending parallel to each other securing the circuit board to a supporting means;
    and conveying the circuit board and supporting means in a direction substantially perpendicular to the height of the disc cutters, the conveying step including engaging and rotating the first shaft in a first direction, the second shaft being unengaged for freely rotating, the first one of the pair of disc cutters rotating in the first direction and the second one of the pair of disc cutters rotating in a direction opposite to that of the first one of the pair of disc cutters in response to engagement by the circuit board as the circuit board is conveyed through the cutting edge, the supporting means freely traversing in a direction substantially perpendicular to the height of the disc cutters.

2. A device for separating a populated multiple partitioned printed circuit board comprising:
    at least one pair of disc cutters positioned in opposed alignment and minimally spaced apart for providing a bifurcated cutting edge, a first one and a second one of the pair of disc cutters being respectively mounted on a first and a second shaft spaced apart and extending parallel to each other;
    means for conveying the circuit board in a direction substantially perpendicular to the height of the disc cutters, the conveying means including means for engaging and rotating the first shaft in a first direction, the second shaft being unengaged for freely rotating, the first one of the pair of disc cutters rotating in the first direction and the second one of the pair of disc cutters rotating in a direction opposite to that of the first one of the pair of disc cutters in response to engagement by the printed circuit board as the circuit board is conveyed through the cutting edge; and
    means for supporting the circuit board while being conveyed through the cutting edge formed by the pair of disc cutters, the supporting means being arranged for freely traversing in a direction substantially perpendicular to the height of the disc cutters.
    said supporting means having means for securing said circuit board thereto, wherein said supporting means traverses as a result of said conveying means acting on said circuit board.

3. The device for separating a multiple partitioned printed circuit board as in claim 1 wherein the means for conveying the circuit board further includes gripping means formed by the engaging of the board between the pair of disc cutters, the board being simultaneously conveyed and separated by its engagement between the pair of disc cutters.

4. The device for separating a multiple partitioned printed circuit board as in claim 1, wherein the means for conveying the circuit board further includes initially engaging the supporting means for advancing the board to a juncture where the board is positioned in engagement with the bifurcated cutting edge, the supporting means being unengaged and freely traversing as the board is advanced beyond this juncture by the gripping means.

5. The device for separating a multiple partitioned circuit board as in claim 3 wherein each one of the pair of disc cutters includes an outer peripheral wedged-shaped cutting surface formed by the intersection of an inner surface extending generally perpendicular from the rotational axis of the disc cutter and an outer surface extending at an angle from the rotational axis of the disc cutter.

6. The device for separating a multiple partitioned printed circuit board as in claim 5 wherein the outer peripheral wedged-shaped cutting surface of each one of the pair of disc cutters includes serrations thereupon, the serrations being spaced about the circumference of the disc cutter.

7. The device for separating a multiple partitioned printed circuit board as in claim 6 wherein commonly opposed scribed sections of the board reflective of the multiple partitions are conveyed through the cutting edge formed by the pair of disc cutters.

* * * * *